United States Patent
Nagai

(10) Patent No.: US 9,887,099 B2
(45) Date of Patent: Feb. 6, 2018

(54) PATTERN FORMING METHOD CAPABLE OF MINIMIZING DEVIATION OF AN INVERSION PATTERN

(71) Applicant: TOKYO ELECTRON LIMITED, Tokyo (JP)

(72) Inventor: Hiroyuki Nagai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/340,508

(22) Filed: Nov. 1, 2016

(65) Prior Publication Data

US 2017/0125262 A1    May 4, 2017

(30) Foreign Application Priority Data

Nov. 4, 2015 (JP) ................. 2015-216524

(51) Int. Cl.
*H01L 21/311* (2006.01)
*H01L 21/02* (2006.01)

(52) U.S. Cl.
CPC .... *H01L 21/31144* (2013.01); *H01L 21/0228* (2013.01); *H01L 21/0234* (2013.01); *H01L 21/02186* (2013.01); *H01L 21/02192* (2013.01)

(58) Field of Classification Search
CPC ............. H01L 21/31144; H01L 21/311; H01L 21/02186; H01L 21/02192; H01L 21/0228
See application file for complete search history.

(56) References Cited

U.S. PATENT DOCUMENTS 7,932,176 B2 * 4/2011 Gordon ................. C23C 16/16
257/E21.485
2009/0263965 A1 10/2009 Gordon et al.

FOREIGN PATENT DOCUMENTS

JP    2012-134378 A    7/2012
WO   2012/060428 A1   5/2012

* cited by examiner

*Primary Examiner* — Andrew Q Tran
(74) *Attorney, Agent, or Firm* — Nath, Goldberg & Meyer; Jerald L. Meyer

(57) ABSTRACT

A method includes: forming a metal oxide film on a substrate including an etching target film and a metal pattern formed thereon, and forming an oxide film having a relatively strong oxygen bond on the metal pattern; performing a reduction treatment such that the metal oxide film formed on the metal pattern is defined as a first metal-containing film and the metal oxide film formed on the etching target film is defined as a second metal-containing film whose surface is reduced into metal; selectively forming a metal film on only the second metal-containing film formed on the etching target film, the metal film having such a property that it is easy to be formed on metal and is hard to be formed on an oxide; and obtaining an inversion pattern composed of the inversion material by etching away the metal pattern and leaving the inversion material and the metal film.

18 Claims, 10 Drawing Sheets

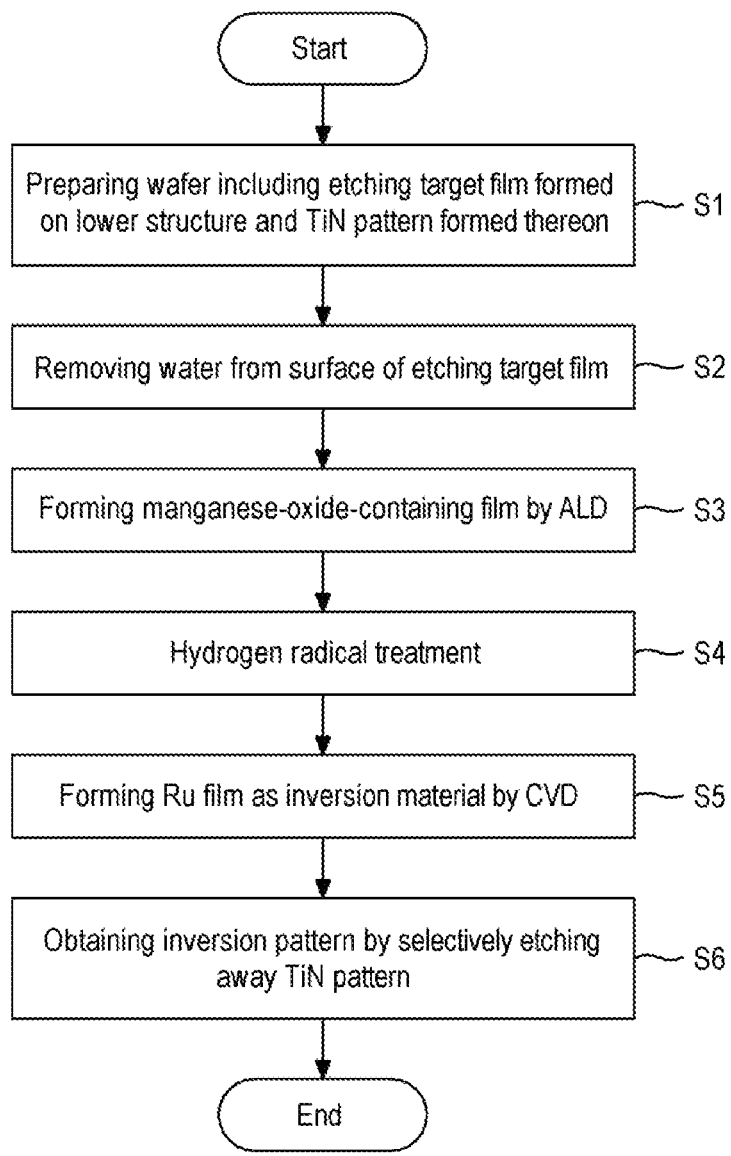

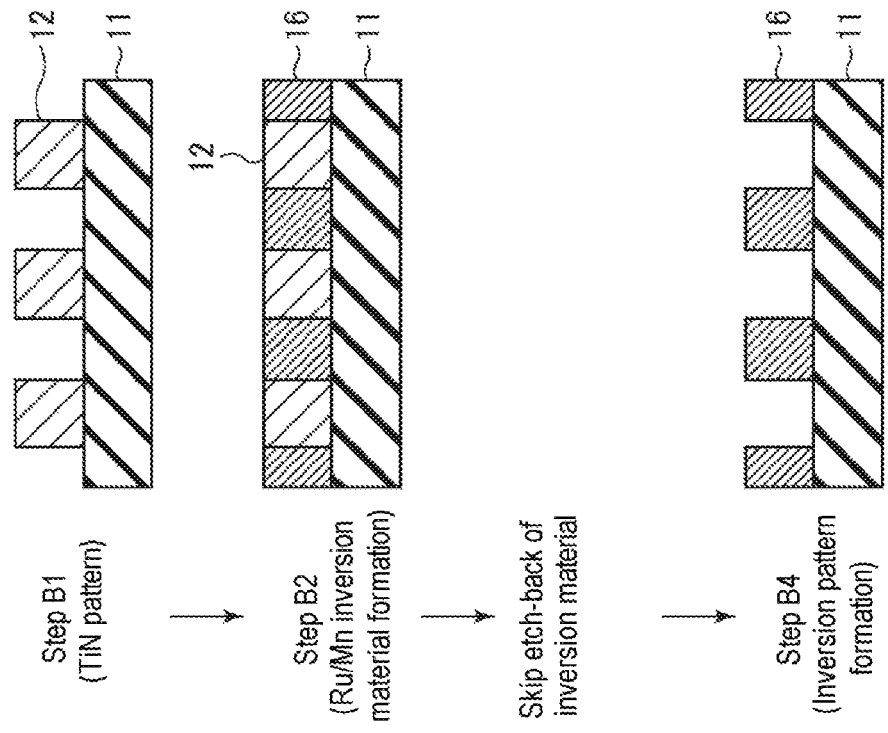
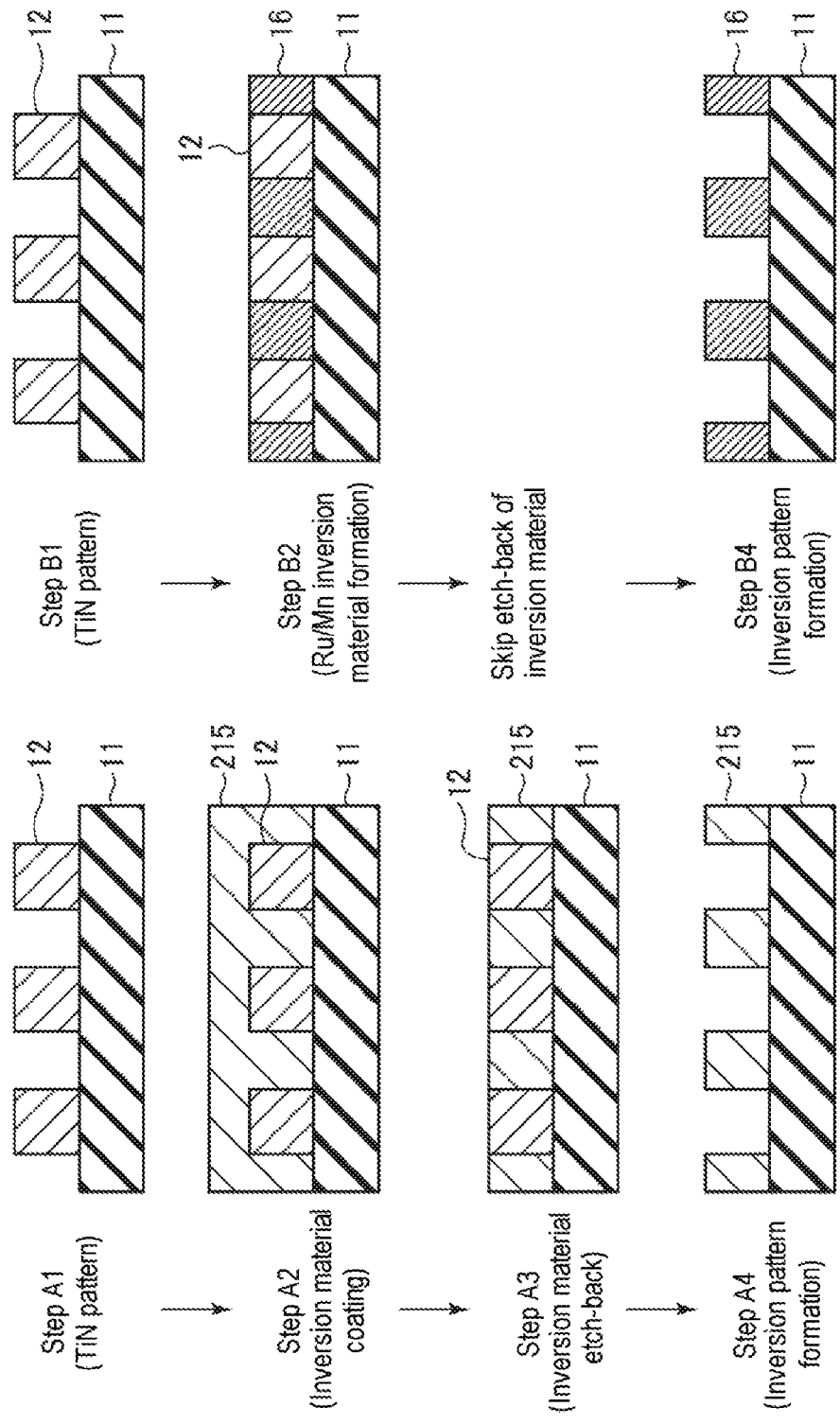

FIG. 5A
Step S3
(ALD-manganese-oxide-containing film)

On etching target film
(On TEOS film)

| Manganese-oxide -containing film | ~13 |
| TEOS | ~11 |

Manganese-oxide-containing film formed by ALD exists as it is

On TiN pattern
(On TiN film)

| $MnTiO_3$ or $Mn_2TiO_4$ | |
| TiN | ~12 |

$MnTiO_3$ or $Mn_2TiO_4$ is generated by reaction of Ti, $H_2O$ and Mn

FIG. 5B
Step S4
(Hydrogen radical treatment)

| Metal Mn is generated on surface | ~14b |
| TEOS | ~11 |

Manganese-oxide-containing film is reduced to become Mn-containing film including metal Mn formed thereon

| As oxide film | ~14a |
| TiN | ~12 |

Surface is not reduced into metal Mn and becomes first Mn-containing film as oxide since $MnTiO_3$ or $Mn_2TiO_4$ has strong oxygen bond

FIG. 5C
Step S5
(Ru film formation)

| Ru film | |
| Metal Mn is generated on surface | ~14b |
| TEOS | ~11 |

Ru film is deposited since surface of second Mn-containing film is metal Mn

| As oxide film | ~14a |
| TiN | ~12 |

Ru film is hardly deposited since first Mn-containing film is oxide

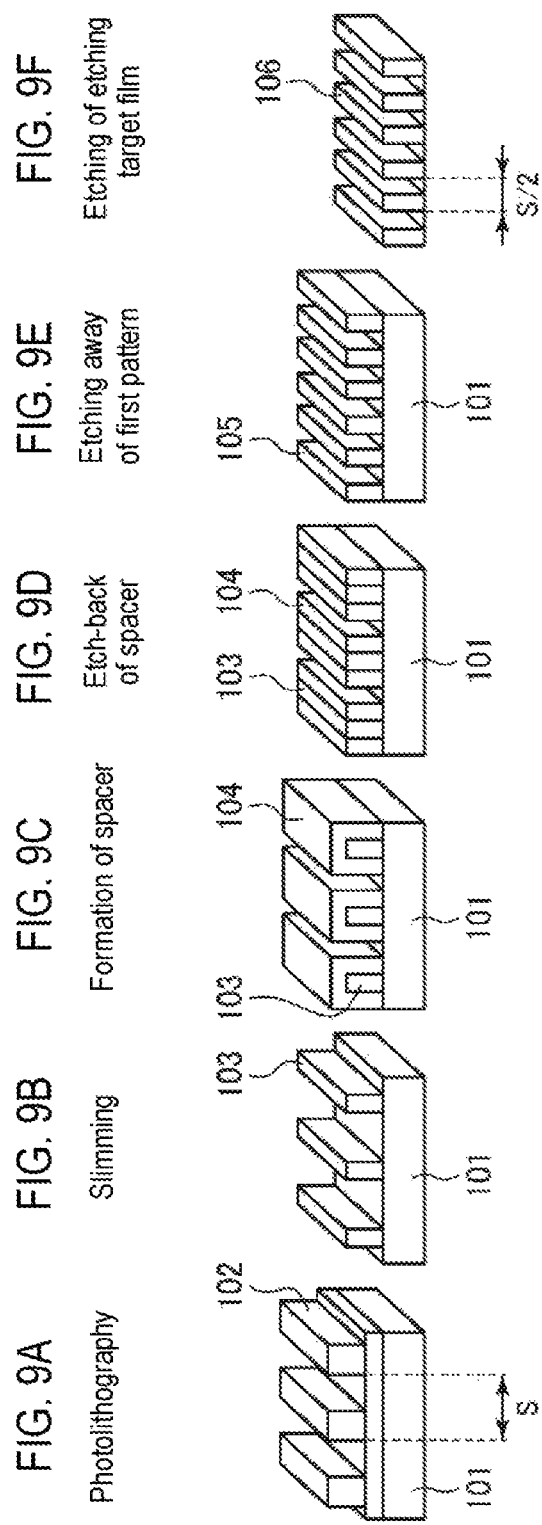

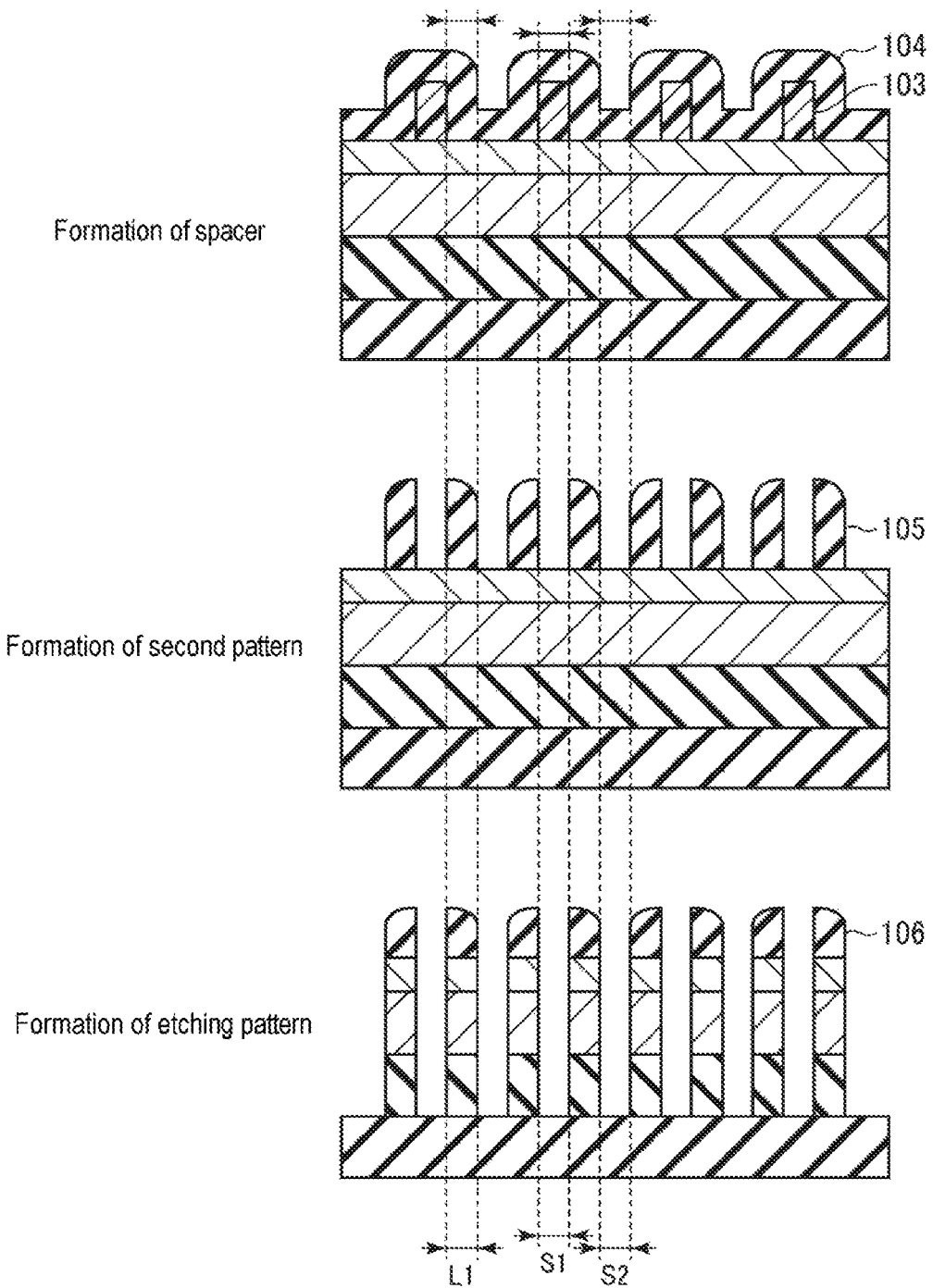

PATTERN FORMING METHOD CAPABLE OF MINIMIZING DEVIATION OF AN INVERSION PATTERN

CROSS-REFERENCE TO RELATED APPLICATION

This application claims the benefit of Japanese Patent Application No. 2015-216524, filed on Nov. 4, 2015, in the Japan Patent Office, the disclosure of which is incorporated herein in its entirety by reference.

TECHNICAL FIELD

The present disclosure relates to a method of forming a pattern in a semiconductor process.

BACKGROUND

As the next-generation exposure technology adapted for miniaturization of semiconductor devices in the future, an extreme ultraviolet (EUV) technology using a very short wavelength of 13.5 nm is under consideration. However, this EUV technology is not mass produced due to the lack of a light source having adequate luminance Thus, there is a need to employ other approaches.

As such, multi-patterning methods based on exposure of ArF having a wavelength of 193 nm have been mainly applied. Among these methods, a patterning method called a self-align double patterning (SADP) has been widely used. As shown in FIGS. 9A to 9F, the SADP method includes: forming a pattern 102 having a pitch of S on an etching target layer 101 by photolithography (FIG. 9A); forming a first pattern 103 called a mandrel (core material) by slimming (FIG. 9B); forming a spacer 104 along the first pattern 103 (FIG. 9C); etching-back the spacer 104 (FIG. 9D); etching the first pattern (mandrel) 103 to form a second pattern 105 using spacers (FIG. 9E); and etching the etching target layer 101 using the second pattern 105 as a mask (FIG. 9F). Thus, an etching pattern 106 having a pitch of S/2 is obtained. That is to say, it is possible to obtain a pattern having a pitch of S/2 which is half the pitch of S formed with only photolithography. Further, a self-align quadruple patterning (SAQP) method capable of reducing the pitch by ¼ by repeating the SADP method once again is under consideration. As another multi-patterning method, there has been used an LEx method which repeats a litho etching method plural times (x times), such as a litho etch-litho etch (LELE) method which includes transferring an exposed pattern onto a hard mask of a substrate by etching, performing a secondary exposure at a position deviated by a pitch of ½, machining the hard mask.

These methods pose a noticeable problem in that it is difficult to control deviation and work precision due to the increased number of processes. For example, for the SADP method, there are two types of space portions (S) of a line-and-space (L/S) by nature. One of them is affected by a spacer film thickness deviation, an etching deviation and a lithography CD deviation. Thus, a CD deviation of the final space portion tends to increase. On the other hand, line portions L are affected by only the spacer film thickness deviation and the etching deviation. Specifically, as shown in FIG. 10, all the line portions L1 correspond to the width of the spacer 104, and their deviation depends only on the film thickness of the spacer 104 and etching. In contrast, for the space portions, there are two types, i.e., a first space S1 corresponding to the first pattern 103 and a second space S2 corresponding to a space between adjacent spacers 104. A deviation of the first space S1 depends only on lithography CD and etching, whereas a deviation of the second space S2 depends on lithography CD, spacer film thickness and etching.

At present, a semiconductor device wiring process mainly uses Cu wiring using a damascene structure. In this case, a space portion formed by the SADP method becomes a wiring portion. That is to say, this means that a deviation of the wiring portion increases. This situation is caused even in the SAQP method and the LEx method.

However, in the wiring process, there are many cases where the deviation of the wiring portion is more problematic than a deviation in an insulating portion. Therefore, an inversion method which is capable of minimizing the deviation of the wiring portion by inverting a line portion and a space portion is under consideration.

In addition, a typical inversion method inverts a line portion and a space portion through a series of processes including: forming an inversion material on a pattern, etching-back the inversion material, and etching away the original pattern. However, such a method includes a number of processes, which causes deviations. In addition, a problem occurs in that work controllability is difficult. Therefore, such an inversion method is not actively practiced in reality.

SUMMARY

Some embodiments of the present disclosure provide a pattern forming method which is capable of minimizing deviation when inverting a pattern.

According to one embodiment of the present disclosure, there is provided a pattern forming method which includes: forming a metal oxide film as a portion of an inversion material on a substrate including an etching target film and a metal pattern formed on the etching target film, and forming an oxide film on the metal pattern, the oxide film having a relatively strong oxygen bond with respect to the metal pattern rather than the etching target film; subsequently, performing a reduction treatment such that the metal oxide film formed on the metal pattern is defined as a first metal-containing film which remains as an oxide and the metal oxide film formed on the etching target film is defined as a second metal-containing film whose surface is reduced into metal; subsequently, selectively forming a metal film, as a portion of the inversion material, on only the second metal-containing film formed on the etching target film, the metal film having such a property that it is easy to be formed on metal and is hard to be formed on an oxide; and subsequently, obtaining an inversion pattern composed of the inversion material by etching away the metal pattern and leaving the inversion material composed of the first metal-containing film and the second metal-containing film, which are obtained from the metal oxide film, and the metal film.

According to another embodiment of the present disclosure, there is provided a pattern forming method, which includes: forming a manganese-oxide-containing film as a portion of an inversion material on a substrate including an etching target film and a metal pattern formed on the etching target film, by ALD; subsequently, performing a hydrogen radical treatment on a surface of the manganese-oxide-containing film; subsequently, forming a Ru film as a portion of the inversion material by CVD; and subsequently, obtaining an inversion pattern composed of the inversion material for etching the etching target film, by etching away the metal pattern and leaving the inversion material composed of a material obtained by performing the hydrogen radical treatment on the surface of the manganese-oxide-containing film and the Ru film. The metal pattern is made of a material such that the manganese-oxide-containing film formed on the metal pattern is not substantially reduced into a metal Mn with the hydrogen radical treatment. The manganese-oxide-containing film formed on the metal pattern is defined as a first Mn-containing film which remains as an oxide when subjecting to the hydrogen radical treatment. The manganese-oxide-containing film formed on the etching target film is defined as a second Mn-containing film whose surface is reduced into a metal Mn when subjecting to the hydrogen radical treatment. The Ru film is not substantially formed on the first Mn-containing film and is selectively formed on the second Mn-containing film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart illustrating a pattern forming method according to one embodiment of the present disclosure.

FIGS. 3A and 3B are schematic process views illustrating a comparison between an inversion process using a conventional inversion material and one embodiment of the present disclosure.

FIGS. 5A to 5C are views illustrating a mechanism in which a Ru film is selectively formed on an etching target film through Steps S3 to S5.

FIGS. 9A to 9F are views illustrating a procedure of forming a pattern using an SADP method.

FIG. 10 is a view illustrating a pattern width and a space width when forming the pattern using the SADP method

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a flow chart illustrating a pattern forming method according to one embodiment of the present disclosure. FIGS. 2A to 2E are sectional views for explaining processes of the pattern forming method.

<Outline of Pattern Forming Method>

Figure 2A:
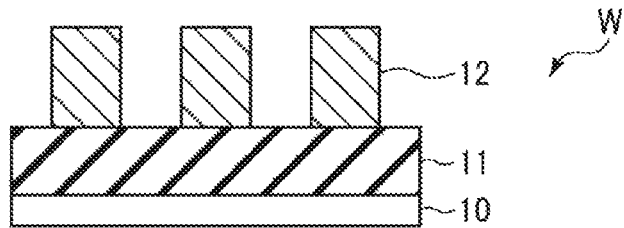
FIGS. 2A to 2E are sectional views for explaining processes of the pattern forming method according to one embodiment of the present disclosure.
Figure 2B:
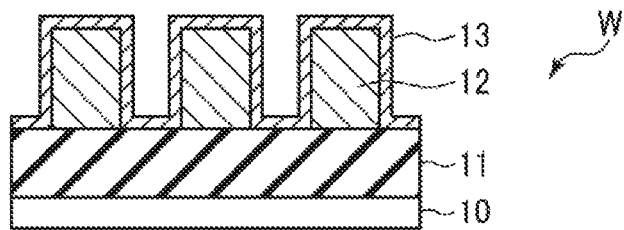

In this embodiment, first, a substrate W, e.g., a semiconductor wafer (hereinafter simply referred to as a "wafer") is prepared (Step S1, FIG. 2A). The wafer W includes a lower structure 10 (details thereof are omitted) obtained by a FEOL (Front End Of Line), an etching target film 11 formed on the lower structure 10, and a TiN pattern 12 formed as a metal pattern on the etching target film 11. The TiN pattern 12 is formed by patterning a metal film, for example, a TiN film, using a multi-patterning method such as the aforementioned SADP, SAQP or LEx method. Although not particularly limited, the etching target film 11 may be formed of a Si-containing material, such as a $SiO_2$ film (TEOS film or the like), a low dielectric constant (low-k) film (SiCO film, SiCOH film or the like), a SiN film or the like. The etching target film 11 is formed as, e.g., an interlayer dielectric film.

Subsequently, the wafer W is subjected to a pre-process such as a degas process or a pre-clean process to remove water remaining in a surface of the etching target film 11 (Step S2, not shown in FIG. 2). Thereafter, as a metal oxide film which is a portion of an inversion material, a manganese-oxide-containing film 13 is formed on the etching target film 11 represented by the interlayer dielectric film and the TiN pattern 12 which is a metal pattern film, by ALD (Step S3, FIG. 2B). Since a manganese oxide may include a plurality of forms such as MnO, $Mn_3O_4$, $Mn_2O_3$, $MnO_2$ or the like, the manganese oxide may be collectively represented by $MnO_x$.

Figure 2C:
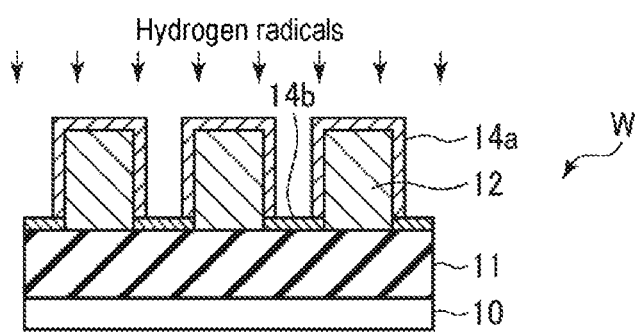

Subsequently, the manganese-oxide-containing film 13 formed by ALD is subjected to a hydrogen radical treatment (Step S4, FIG. 2C). This treatment is to reduce a surface of the manganese-oxide-containing film 13 into a metal Mn and to easily form a Ru film 15 as a portion of an inversion material to be formed next, on the etching target film 11 which contains silicon. However, as will be described later, in the manganese-oxide-containing film 13, a surface of a portion that is brought into contact with the TiN pattern 12 is not reduced into the metal Mn although it is subjected to the hydrogen radical treatment, so that the portion constitutes a first Mn-containing film 14a staying in an oxide state. Further, in the manganese-oxide-containing film 13, only a surface of a portion that is brought into contact with the etching target film 11 is reduced, thus constituting a second Mn-containing film 14b with metal Mn generated thereon. In addition, by the hydrogen radical treatment, a portion of the second Mn-containing film 14b is silicated by reaction with the Si-containing film 11.

Figure 2D:
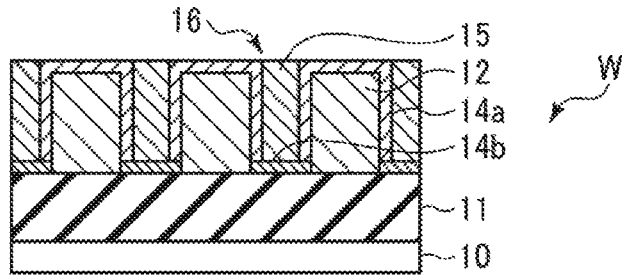

Thereafter, as a metal film which constitutes an inversion material along with the manganese-oxide-containing film, the Ru film 15 is formed by CVD (Step S5, FIG. 2D). Thus, a Ru/Mn inversion material 16 containing Ru and Mn is formed. The Ru film formed by CVD has the property that it can be formed on metal but cannot be formed on an oxide. Therefore, the Ru film 15 is not formed on the first Mn-containing film 14a that is brought into contact with the TiN pattern 12 and is formed on only the second Mn-containing film 14b that is brought into contact with the etching target film 11. That is to say, the Ru film 15 is not formed on the first Mn-containing film 14a formed on the top of the TiN pattern 12 and is formed in only a space portion. This eliminates the need to perform an etch-back process on the inversion material.

Figure 2E:
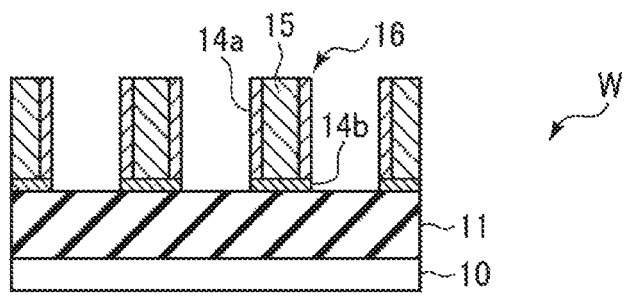

Thereafter, with the inversion material 16 left, by selectively etching away the TiN pattern 12 (and the first Mn-containing film 14a having a thin thickness, formed on the TiN pattern 12), an inversion pattern composed of the inversion material 16 is formed (Step S6, FIG. 2E). Specifically, the inversion material 16 constituting the inversion pattern includes the Ru film 15, the first Mn-containing film 14a formed on lateral sides of the Ru film 15, and the second Mn-containing film 14b existing below the Ru film 15.

As described above, in this embodiment, there is no need to perform the etch-back process on the inversion material, which is required for an inversion process using a conventional inversion material.

That is to say, in the inversion process using the conventional inversion material, as schematically shown in FIG. 3A, a wafer W having a TiN pattern 12 formed by, e.g., a SADP method is prepared (Step A1). Subsequently, an inversion material 215 is formed on the wafer W by coating (Step A2). Then, the inversion material 215 is relatively thickly coated on the top surface of the TiN pattern 12. For the aforementioned reason, the inversion material 215 is etched back (Step A3). Thereafter, the TiN pattern 12 is etched to form an inversion pattern composed of the inversion material 215 (Step A4). On the contrary, in this embodiment, as schematically shown in FIG. 3B, a wafer W having a TiN pattern 12 is prepared (Step B1), like Step A1. Subsequently, as described above, a Ru/Mn inversion material 16 is formed on the wafer W (Step B2). Thereafter, without going through etch-back of the inversion material, with the inversion material 16 left, a TiN pattern 12 is etched away while skipping the etch-back process for the inversion material 16 and allowing the inversion material 16 to remain, thus forming an inversion pattern composed of the inversion material 16 (Step B4).

As described above, in this embodiment, it is possible to omit the etch-back process for the inversion material. This addresses problems such as deviations and work controllability which are attributable to the etch-back process, in the inversion process using the conventional inversion material.

In this embodiment, the inversion pattern is formed by the formation of the manganese-oxide-containing film, the hydrogen radical treatment, the formation of the Ru film and the selective removal of the TiN pattern. The formation of the manganese-oxide-containing film, the hydrogen radical treatment and the formation of the Ru film do not cause problems such as deviations and work controllability attributable to the etch-back process. Therefore, it is possible to omit the etch-back process and to reduce deviation when the pattern is inverted. In some embodiments, the formation of the manganese-oxide-containing film, the hydrogen radical treatment and the formation of the Ru film may be continuously performed while maintaining a vacuum state. Thus, it is possible to prevent the films from being oxidized during these processes and form the inversion pattern with high precision.

Figure 4:
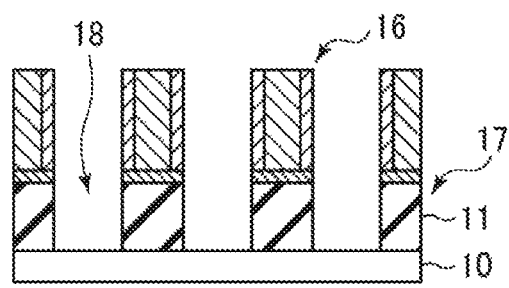
FIG. 4 is a view illustrating a state where a film is etched using an inversion pattern obtained in the pattern forming method according to one embodiment of the present disclosure as a mask.

In addition, as shown in FIG. 4, an etching pattern 17 is formed by etching the etching target film 11 using the inversion material 16 constituting the inversion pattern as a mask. The etching target film 11 is, e.g., an interlayer dielectric film. Concave portions 18 of the etching pattern 17 are filled with, e.g., a Cu film, to form a Cu wiring.

<Details of Main Processes>

Next, Steps S3 to S5, which are main steps among the above-described steps, will be described in more detail.

(Step S3)

First, Step S3 of forming the manganese-oxide-containing film 13 will be described. The manganese-oxide-containing film 13 formed on the TiN films 12 which are metal pattern films is formed as an oxide film which is not reduced into metal with the hydrogen radical treatment and metal elements of which oxide have a strong bond with oxygen.

The manganese-oxide-containing film 13 is formed by ALD in which a manganese compound gas and an oxygen-containing gas such as $H_2O$ or the like are alternately supplied while performing a purging process on a processing container between the supply of the manganese compound gas and the supply of the oxygen-containing gas, with an internal pressure of the processing container set to 0.133 Pa to 13.3 Pa. At this time, the manganese-oxide-containing film 13 reacts with Si and O components in the etching target film 11 at least at boundary portions with the etching target film 11 by heat generated in the film formation or subsequent processes (the hydrogen radical treatment, an annealing treatment or the like). Thus, a manganese silicate ($Mn_xSiO_y$, ($MnSiO_3$ or $Mn_2SiO_4$)) is formed.

In addition, when the manganese-oxide-containing film 13 is formed, $MnTiO_3$ or $Mn_2TiO_4$ having a robust bond is formed on the TiN pattern 12 by reacting Ti in the TiN pattern 12 with $H_2O$ and Mn supplied at the time of the formation of the manganese-oxide-containing film 13 by ALD.

The manganese compound gas used to form the manganese-oxide-containing film 13 may include a cyclopentadienyl-based manganese compound, an amidinate-based manganese compound, an amide amino alkane-based manganese compound or the like.

An example of the cyclopentadienyl-based manganese compound may include bis(alkylcyclopentadienyl)manganese represented by a chemical formula $Mn(RC_5H_4)_2$, such as $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $t-BuCp)_2Mn[=Mn(C_4H_9C_5H_4)_2]$ or the like.

An example of the amidinate-based manganese compound may include bis(N,N'-dialkylacetamidinate)manganese represented by a chemical formula $Mn(R^1N—CR^3—NR^2)_2$ as disclosed in US Patent Publication No. 2009/0263965.

An example of the amide amino alkane-based manganese compound may include bis(N,N'-1-alkylamide-2-dialkylaminoalkane)manganese represented by a chemical formula $Mn(R^1N—Z—NR^2)_2$ as disclosed in WO 2012/060428. In the above chemical formulas, "R, R', $R^2$ and $R^3$" are functional groups represented by $—C_nH_{2n+1}$ (where, n is an integer of zero or more) and "Z" is a functional group represented by $—C_nH_{2n}—$ (where, n is an integer of one or more).

As other manganese compounds, a carbonyl-based manganese compound and a beta-diketone-based manganese compound may be used. An example of the carbonyl-based manganese compound may include a deca-carbonyl 2 manganese ($Mn_2(CO)_{10}$) and a methylcyclopentadienyltricarbonyl manganese ($(CH_3C_5H_4)Mn(CO)_3$). Among these, ($Mn_2(CO)_{10}$) has a simple structure and is useful to form a Mn film having few impurities.

In addition, as the oxygen-containing gas, $H_2O$ (vapor), $N_2O$, $NO_2$, $NO$, $O_3$, $O_2$, $H_2O_2$, $CO$, $CO_2$ or alcohols such as methyl alcohol or ethyl alcohol may be used.

In addition, from the viewpoint of preventing a surface of the manganese-oxide-containing film 13 from being rough in a CVD mode, a temperature when the manganese-oxidecontaining film 13 is formed by atomic layer deposition (ALD) may set to be lower than an initial temperature of thermal decomposition of the manganese compound as a film forming raw material. Further, if a temperature of an organic Mn compound is lower than a vaporization starting temperature, gas cannot be supplied into the processing container in a gaseous state. Thus, the vaporization starting temperature is set to a virtual lower limit.

When the organic Mn compound is the amide amino alkane-based manganese compound (bis(N, N'-1-alkylamide-2-dialkylaminoalkane) manganese), the thermal decomposition begins near 230 degrees C. Thus, the ALD-based film formation temperature may be set to be lower than 230 degrees C. In addition, in order to effectively vaporize the manganese compound, it is necessary to heat the manganese compound at a temperature of 80 degrees C. or higher. The ALD-based film formation temperature may be set at 100 to 180 degrees C., specifically, about 130 degrees C. in order to avoid a CVD mode as much as possible and increase a film formation rate. In addition, for other suitable Mn compounds such as the cyclopentadienyl-based manganese compound and the amidinate-based manganese compound, a Mn film may be formed to have the same film thickness in the same temperature range.

(Step S4)

Next, Step S4 of performing the hydrogen radical treatment will be described. The hydrogen radical treatment is to reduce the manganese-oxide-containing film 13 and to modify the surface of the manganese-oxide-containing film 13 into a metal Mn. This treatment facilities the formation of the Ru film 15. That is to say, if an underlying film of a Ru film is an oxide film, a formation density of Ru nucleation is decreased so that it is hard for the Ru film to be deposited. However, if the underlying film is metal, the formation density of Ru nucleation is increased so that it is easy for the Ru film to be deposited. Therefore, the Ru film 15 is easily formed in a portion where the surface of the manganese-oxide-containing film 13 is modified into metal Mn by the hydrogen radical treatment.

On the other hand, a portion of the manganese-oxide-containing film 13 that is brought into contact with the TiN pattern 12 is made of $MnTiO_3$ or $Mn_2TiO_4$ as described above. These $MnTiO_3$ and $Mn_2TiO_4$ have a strong oxygen bond. Therefore, the manganese-oxide-containing film 13 is not reduced to metal with the hydrogen radical treatment so that the portion becomes the first Mn-containing film 14a as an oxide as it is. Thus, only a surface of a portion of the manganese-oxide-containing film 13 that is brought into contact with the etching target film 11 containing silicon is reduced by the hydrogen radical treatment so that the portion becomes the second Mn-containing film 14b with metal Mn generated thereon.

In some embodiments, the hydrogen radical treatment may be performed without exposing the manganese-oxide-containing film 13 to ambient air after forming the manganese-oxide-containing film 13. After the manganese-oxide-containing film 13 is formed, if the manganese-oxide-containing film 13 is exposed to the ambient air, a degas treatment may be performed prior to the hydrogen radical treatment inside the processing container where the hydrogen radical treatment is to be performed.

The hydrogen radical treatment can be performed in any methods as long as it can generate hydrogen radicals (atomic hydrogens). For example, a remote plasma treatment, a plasma treatment and a treatment of contacting a hydrogen gas to a heating filament may be used in place of the hydrogen radical treatment.

The remote plasma treatment is to generate hydrogen plasma using inductively-coupled plasma or microwave plasma outside the processing container, supply the generated hydrogen plasma into the processing container, and treat the manganese-oxide-containing film 13 with hydrogen radicals in the hydrogen plasma.

The plasma treatment is to generate capacitively-coupled plasma or inductively-coupled plasma inside the processing container and treat the manganese-oxide-containing film 13 with hydrogen radicals in hydrogen plasma generated inside the processing chamber.

The treatment of contacting a hydrogen gas to a heating filament is to generate hydrogen radicals by a catalytic cracking reaction using the heating filament as a catalyst.

A treatment temperature (wafer temperature) of the hydrogen radical treatment is an important factor in determining the reducibility of the manganese-oxide-containing film 13. In order to obtain sufficient reducibility, the treatment temperature may fall within a range of 200 to 400 degrees C., specifically 300 to 400 degrees C. In addition, a treatment time of the hydrogen radical treatment is also an important factor in determining the reducibility of the manganese-oxide-containing film 13. In order to obtain sufficient reducibility, the treatment time may fall within a range of 100 sec or longer, specifically 300 sec or so.

A gas supplied for the hydrogen radical treatment may be gas obtained by adding an inert gas such as an Ar gas to a hydrogen gas. A concentration of hydrogen at this time may fall within a range of 1 to 50%. In addition, a treatment pressure of the hydrogen radical treatment may fall within a range of 10 to 500 Pa, specifically 20 to 100 Pa.

(Step S5)

Next, Step S5 of forming the Ru film 15 will be described. The Ru film 15 may be formed by a thermal CVD using ruthenium carbonyl ($Ru_3(CO)_{12}$) as a film forming raw material. Thus, a highly purified thin Ru film can be formed with high step coverage. In this case, the film formation temperature may fall within a range of 175 to 230 degrees C. and the treatment pressure may fall within a range of 1.3 to 133 Pa.

In addition, the Ru film 15 may be formed by CVD using film forming raw materials other than ruthenium carbonyl, e.g., pentadienyl compounds of ruthenium, such as (cyclopentadienyl)(2,4-dimethylpentadienyl) ruthenium, bis (cyclopentadienyl)(2,4-methylpentadienyl) ruthenium, (2,4-dimethylpentadienyl)(ethylcyclopentadienyl) ruthenium, bis (2,4-methylpentadienyl)(ethylcyclopentadienyl) ruthenium or the like.

As described above, the CVD-based Ru film has the property that it is easy to be deposited if an underlying film of the Ru film is metal, but is hard to be deposited due to a low formation density of Ru nucleation if the underlying film is an oxide film. For that reason, by performing the above-described hydrogen radical treatment, it is possible to reduce the surface of the manganese-oxide-containing film 13 that is brought into contact with the etching target film 11, thus generating metal Mn and deposit the Ru film 15 on a portion of the metal Mn thus generated. On the other hand, $MnTiO_3$ or $Mn_2TiO_4$ having a strong oxygen bond is formed on the TiN pattern 12. A surface of $MnTiO_3$ or $Mn_2TiO_4$ is not substantially reduced even with the hydrogen radical treatment so that a portion of the formed $MnTiO_3$ or $Mn_2TiO_4$ becomes the first Mn-containing film 14a as an oxide as it is. Thus, it is hard to deposit the Ru film 15 on the manganese-oxide-containing film 13. Therefore, as described above, the Ru film 15 is selectively formed in only a space portion defined between the TiN patterns 12.

<Summarization of Selective Film Forming Mechanism in Steps S3 to S5>

The mechanism for selectively forming the Ru film 15 on the etching target film 11 by Steps S3 to S5 as described above may be summarized as shown in FIGS. 5A to 5C. That is to say, as shown in FIG. 5A, in Step S3, the manganese-oxide-containing film 13 is formed by ALD on the TEOS film constituting the etching target film 11 and the TiN film constituting the TiN pattern 12. For the TEOS film, a surface of the manganese-oxide-containing film 13 is manganese-oxide-containing as it is, whereas for the TiN film, $MnTiO_3$ or $Mn_2TiO_4$ having a strong oxygen bond is generated by reacting Mn in the manganese-oxide-containing film with Ti in the TiN film and $H_2O$.

In this state, the hydrogen radical treatment of Step S4 is performed. Then, as shown in FIG. 5B, a surface of the manganese-oxide-containing film 13 is reduced on the TEOS film constituting the etching target film 11, to thereby form the second Mn-containing film 14b having metal Mn generated thereon. On the other hand, the manganese-oxide-containing film 13 becomes $MnTiO_3$ or $Mn_2TiO_4$ on the TiN film constituting the TiN pattern 12. The $MnTiO_3$ or $Mn_2TiO_4$ has a strong oxygen bond. Therefore, a surface of the $MnTiO_3$ or $Mn_2TiO_4$ is not reduced into metal Mn even with the hydrogen radical treatment. Thus, a portion of the surface of the $MnTiO_3$ or $Mn_2TiO_4$ becomes the first Mn-containing film 14a as an oxide.

Subsequently, the Ru film 15 is formed by CVD in Step S5. As shown in FIG. 5C, the second Mn-containing film 14b having metal Mn generated on the surface thereof is formed on the TEOS film constituting the etching target film 11. Thus, the Ru film 15 is deposited on the second Mn-containing film 14b. On the other hand, the first Mn-containing film 14a as an oxide is formed on the TiN film constituting the TiN pattern 12 so that it is hard to deposit the Ru film 15 on the first Mn-containing film 14a. In this way, the Ru film 15 is selectively formed on the etching target film 11.

<Processing System Suitable to Perform Steps S2 to S5>

Figure 6:
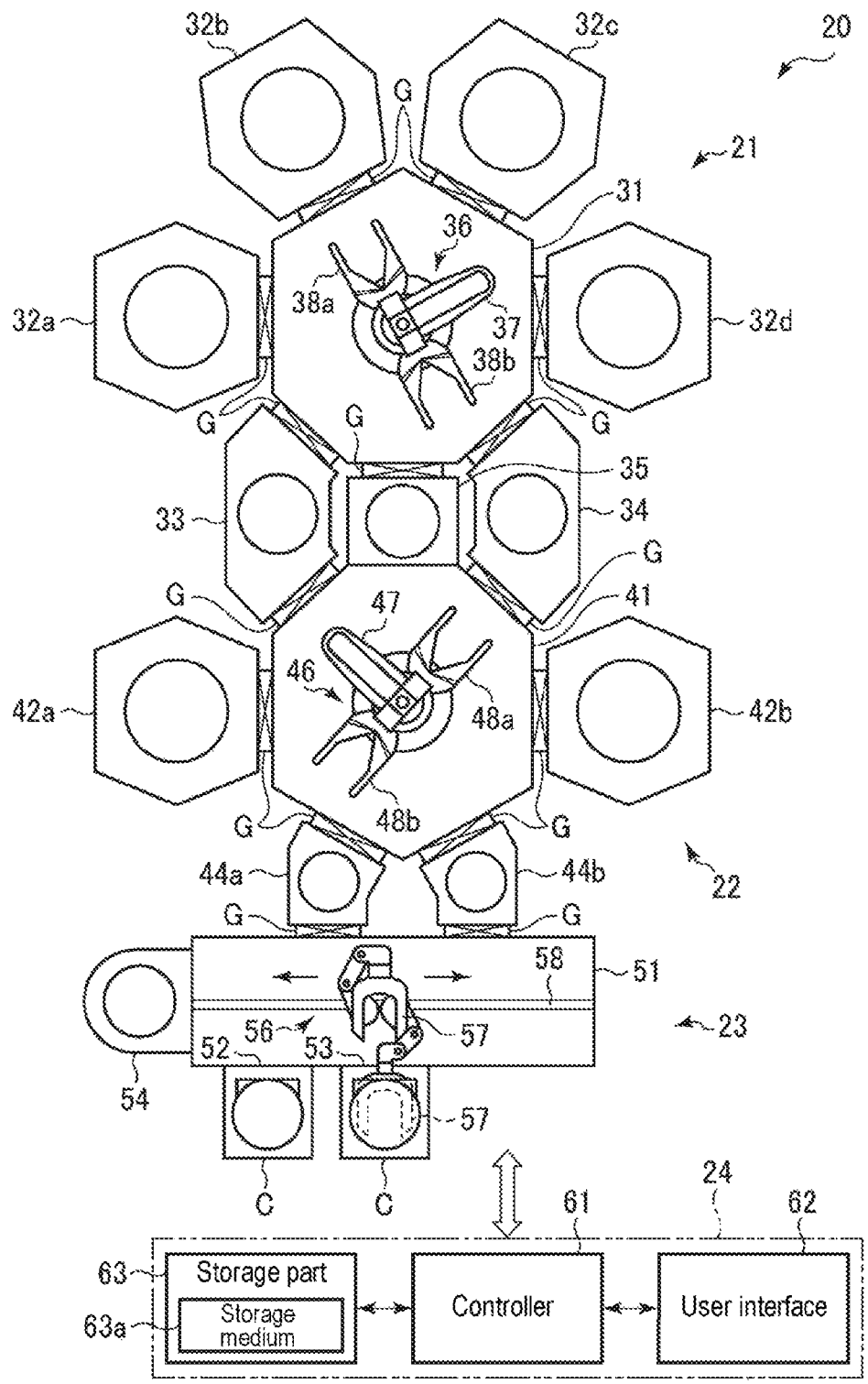
FIG. 6 is a plan view illustrating a processing system which is used to perform Steps S2 to S5 of the pattern forming method according to one embodiment of the present disclosure.

Next, a processing system suitable to perform Steps S2 to S5 will be described. FIG. 6 is a plan view illustrating such a processing system.

As shown in FIG. 6, a processing system 20 includes a first processing section 21 for performing the degassing treatment, the formation of the manganese-oxide-containing film by ALD and the hydrogen radical treatment, a second processing section 22 for forming the Ru film, a loading/unloading section 23 and a control part 24.

The first processing section 21 includes a first vacuum transfer chamber 31, four manganese-oxide-containing film forming apparatuses 32a, 32b, 32c and 32d connected to a wall portion of the first vacuum transfer chamber 31, a degassing chamber 33 and a hydrogen radical treating apparatus 34. The hydrogen radical treating apparatus 34 is also configured to perform the degassing treatment on the wafer W. A delivery chamber 35 for delivering the water W between the first vacuum chamber 31 and a second vacuum transfer chamber 41 to be described later is connected to a wall portion between the degassing chamber 33 of the first vacuum transfer chamber 31 and the hydrogen radical treating apparatus 34.

The manganese-oxide-containing film forming apparatuses 32a, 32b, 32c and 32d, the degassing chamber 33, the hydrogen radical treating apparatus 34 and the delivery chamber 35 are respectively connected to sides of the first vacuum transfer chamber 31 via respective gate valves G.

The inside of the first vacuum transfer chamber 31 is kept at a predetermined vacuum atmosphere. A first transfer mechanism 36 configured to transfer the wafer W is installed inside the first vacuum transfer chamber 31. The first transfer mechanism 36 is disposed substantially in the center of the first vacuum transfer chamber 31, and includes a rotatable and stretchable rotating/stretching part 37 and two support arms 38a and 38b for supporting the wafer W disposed on tips of the rotating/stretching part 37. The first transfer mechanism 36 loads and unloads the wafer W into and from the manganese-oxide-containing film forming apparatuses 32a, 32b, 32c and 32d, the degassing chamber 33, the hydrogen radical treating apparatus 34 and the delivery chamber 35.

The second processing section 22 includes a second vacuum transfer chamber 41 and two Ru film forming apparatuses 42a and 42b connected respectively to face wall portions of the second vacuum transfer chamber 41.

The degassing chamber 33 and the hydrogen radical treating apparatus 34 are respectively connected to two wall portions of the second vacuum transfer chamber 41 at the side facing the first processing section 21. The delivery chamber 35 is connected to the wall portion between the degassing chamber 33 and the hydrogen radical treating apparatus 34. That is to say, the degassing chamber 33, the hydrogen radical treating apparatus 34 and the delivery chamber 35 are all installed between the first vacuum transfer chamber 31 and the second vacuum transfer chamber 41. The degassing chamber 33 and the hydrogen radical treating apparatus 34 are respectively disposed at both sides of the delivery chamber 35. In addition, load lock chambers 44a and 44b capable of transferring the wafer W under atmospheric atmosphere and vacuum atmosphere are respectively connected to two wall portions of the second vacuum transfer chamber 41 at the side facing the loading/unloading section 23.

The Ru film forming apparatuses 42a and 42b, the degassing chamber 33, the hydrogen radical treating apparatus 34 and the load lock chambers 44a and 44b are respectively connected to the wall portions of the second vacuum transfer chamber 41 via respective gate valves G. In addition, the delivery chamber 35 is directly connected to the second vacuum transfer chamber 41 without the gate valve.

The inside of the second vacuum transfer chamber 41 is kept at a predetermined vacuum atmosphere. A second transfer mechanism 46 configured to load and unload the wafer W into and from the Ru film forming apparatuses 42a and 42b, the degassing chamber 33, the hydrogen radical treating apparatus 34, the load lock chambers 44a and 44b and the delivery chamber 35, is installed inside the second vacuum transfer chamber 41. The second transfer mechanism 46 is disposed substantially in the center of the second vacuum transfer chamber 41 and includes a rotatable and stretchable rotating/stretching part 47 and two support arms 48a and 48b for supporting the wafer W at the tip of the rotating/stretching part 47. These two support arms 48a and 48b are attached to the rotating/stretching part 47 to be headed in the other direction.

The loading/unloading section 23 is disposed to face the second processing section 22 through the load lock chambers 44a and 44b and includes an atmospheric transfer chamber 51 connected to the load lock chambers 44a and 44b. A filter (not shown) for forming a down flow of clean air is disposed above the atmospheric transfer chamber 51. Gate valves G are installed in a wall portion between the load lock chambers 44a and 44b and the atmospheric transfer chamber 51. Two connection ports 52 and 53, to which carriers C accommodating wafers W as target substrates are connected, are installed in a wall portion of the atmospheric transfer chamber 51 opposite to the side at which the load lock chambers 44a and 44b are connected. In addition, an alignment chamber 54 for aligning the wafers W is installed at the side of the atmospheric transfer chamber 51. An atmospheric transfer mechanism 56 configured to load and unload the wafers W into and from the respective carrier C and configured to load and unload the wafers W into and from the respective load lock chambers 44a and 44b, is installed inside the atmospheric transfer chamber 51. The atmospheric transfer mechanism 56 includes two articulated arms and is configured to travel on a rail 58 along the arrangement direction of the carriers C. The wafer W is transferred while being mounted on a hand 57 which is the tip of each of the two articulated arms.

The control part 24 includes a process controller 61 made of a microprocessor (computer) for controlling respective components of the processing system 20, a user interface 62 including a keyboard through which an operator inputs commands to manage the processing system 20, a display for visually displaying operation situations of the processing system 20 or the like, a storage part 63 storing a control program for implementing a process executed in the processing system 20 under the control of the process controller 61 and programs (i.e., process recipes) for causing the respective components to execute their respective processes depending on various data and process conditions. The user interface 62 and the storage part 63 are connected to the process controller 61.

The recipes are stored in a storage medium 63 of the storage part 63. The storage medium 63a may be a hard disk, a portable disk such as a CD-ROM, DVD or the like, or a semiconductor memory such as a flash memory or the like. In addition, the recipes may be appropriately downloaded from other apparatuses through, e.g., a dedicated line.

Further, if necessary, by calling any recipe out of the storage medium 63a of the storage part 63 according to an instruction provided from the user interface 62 and causing the process controller 61 to execute the called recipe, a desired process is performed in the processing system 20 under the control of the process controller 61.

Next, the operation of the processing system 20 will be described. The carrier C which accommodates the wafers W each including the etching target film 11 formed on a lower structure and a TiN pattern formed on the etching target film 11 and obtained by patterning a TiN film by a SADP method, is transferred to the film forming system 20 and is connected to the connection port 52 or 53. Thereafter, the wafers W are taken out of the carrier C by the atmospheric transfer mechanism 56 and are transferred to the alignment chamber 54 where the wafers W are aligned. Subsequently, the wafers W are transferred to the load lock chamber 44a or 44b. The load lock chamber 44a or 44b is depressurized to the same degree of vacuum as the second vacuum transfer chamber 41, and subsequently, the wafer W is taken out of the load lock chamber 44a or 44b by the second transfer mechanism 46. The wafer W thus taken is transferred via the second vacuum transfer chamber 41 to the degassing chamber 43 where the wafer W is subjected to the degassing treatment. Thereafter, the wafer W subjected to the degassing treatment is taken out of the degassing chamber 33 by the first transfer mechanism 36 and is transferred to one of the manganese-oxide-containing film forming apparatuses 32a, 32b, 32c and 32d via the first vacuum transfer chamber 31. In the respective manganese-oxide-containing film forming apparatus, a manganese-oxide-containing film as a portion of the inversion material as described above is formed by ALD.

After forming the manganese-oxide-containing film, the wafer W is taken out by the first transfer mechanism 36 and is transferred to the hydrogen radical treating apparatus 34 where the surface of the manganese-oxide-containing film is subjected to the hydrogen radical treatment. Thereafter, the wafer W is taken out of the hydrogen radical treating apparatus 34 by the second transfer mechanism 46 and is transferred via the second vacuum transfer chamber 41 to one of the Ru film forming apparatuses 42a and 42b where a Ru film used as a portion of an inversion material for forming the inversion pattern is formed.

After forming the Ru film, the wafer W is transferred to the load lock chamber 44a or 44b by the second transfer mechanism 46. The respective load lock chamber is then returned to atmospheric pressure, and the wafer W with the Ru film formed thereon is taken out by the atmospheric transfer mechanism 56 and is returned to the carrier C. This process is repeated by the number of the wafers W to be accommodated in the carrier C.

In the processing system 20, the degassing treatment, the forming process of the manganese-oxide-containing film, the hydrogen radical treatment and the forming process of the Ru film are performed with respect to the wafer subjected to the etching process without exposing the wafer to the atmospheric environment. Thus, it is possible to prevent a film from being oxidized during these processes and form an inversion pattern with higher precision.

[Film Forming Apparatus]

Figure 7:
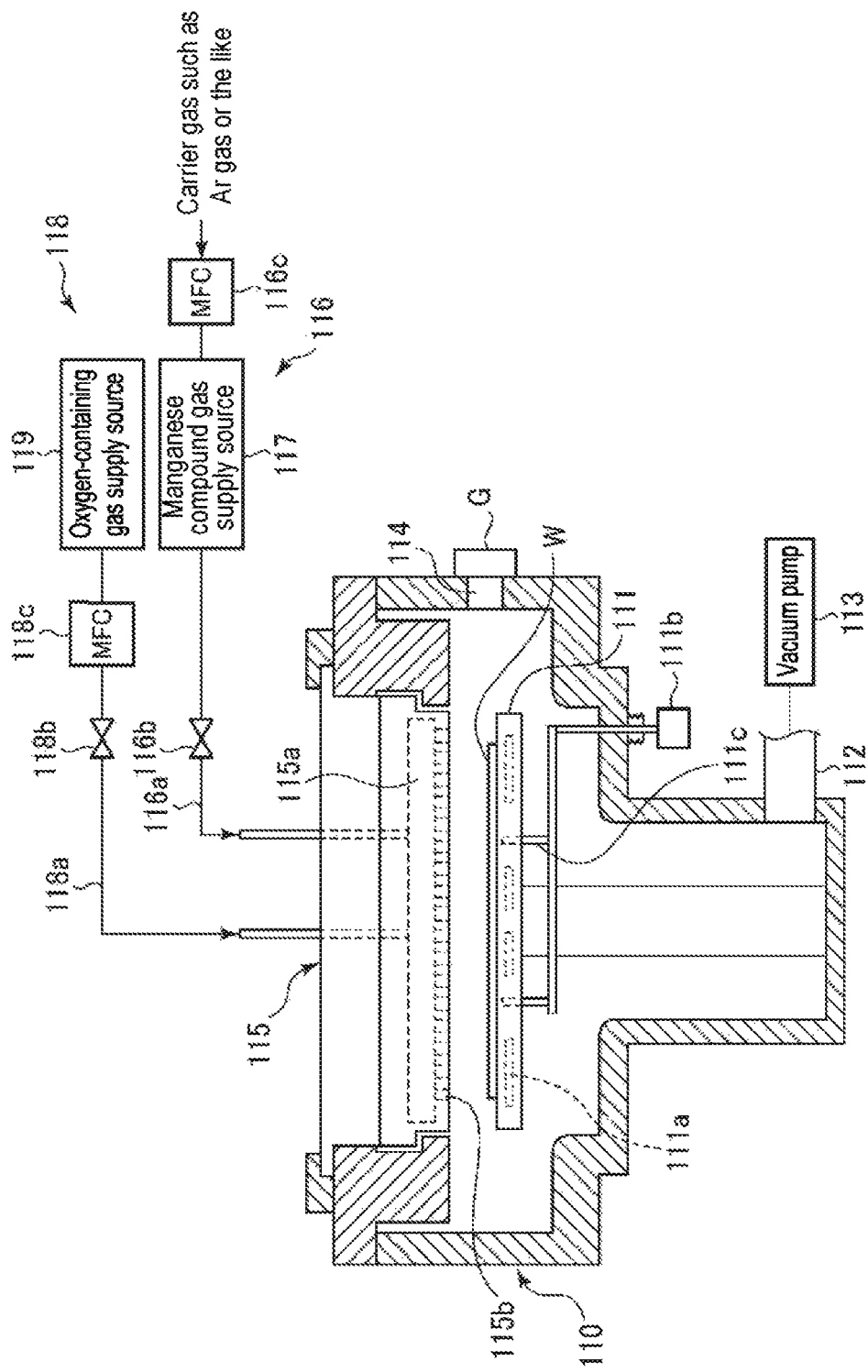
FIG. 7 is a sectional view illustrating one example of a film forming apparatus which can be used for a manganese-oxide-containing film forming apparatus.

Next, a film forming apparatus which can be used for the manganese-oxide-containing film forming apparatuses 32a, 32b, 32c and 32d configured to form the manganese-oxide-containing film by ALD used in the processing system 20 will be described. FIG. 7 is a sectional view illustrating one example of a film forming apparatus. This film forming apparatus can be also applied to the Ru film forming apparatuses 42a and 42b configured to form the Ru film by CVD.

As shown in FIG. 7, this film forming apparatus includes a processing container 110. A mounting table 111 on which the wafer W is horizontally mounted, is installed inside the processing container 111. A heater 111a as a wafer temperature adjusting means is installed within the mounting table 111. In addition, three lifting pins 111c (only two shown in FIG. 7) which can be elevated by an elevating mechanism 111b, are installed in the mounting table 111. The wafer W is delivered between a wafer transfer means (not shown) and the mounting table 111 through these lifting pins 111c.

One end of an exhaust pipe 112 is connected to the bottom portion of the processing container 110. A vacuum pump 113 is connected to the other end of the exhaust pipe 112. A transfer port 114, which is opened and closed by a gate valve G, is formed in the side wall of the processing container 110.

A gas shower head 115 is installed in the ceiling portion of the processing container 110 to face the mounting table 111. The gas shower head 115 includes a gas chamber 115a. Gas supplied into the gas chamber 115a is supplied into the processing container 110 through a plurality of gas discharge holes 115b formed in the gas shower head 115.

A manganese compound gas supply pipe system 116 configured to introduce a manganese compound gas into the gas chamber 115a is connected to the gas shower head 115. The manganese compound gas supply pipe system 116 includes a gas supply path 116a. A valve 116b, a manganese compound gas supply source 117 and a mass flow controller 116c are connected to the upstream side of the gas supply path 116a. The manganese compound gas is supplied from the manganese compound gas supply source 117 by a bubbling method. An Ar gas or the like may be used as a carrier gas for bubbling. This carrier gas also acts as a purge gas.

Further, an oxygen-containing gas supply pipe system 118 configured to introduce an oxygen-containing gas into the gas chamber 115a is connected to the gas shower head 115. The oxygen-containing gas supply pipe system 118 also includes a gas supply path 118a. An oxygen-containing gas supply source 119 is connected to the upstream side of the gas supply path 118a via a valve 118b and a mass flow controller 118c. As the oxygen-containing gas, for example, a $H_2O$ gas, $N_2O$ gas, $NO_2$ gas, NO gas, $O_2$ gas, $O_3$ gas or the like is supplied from the oxygen-containing gas supply source 119. In addition, the oxygen-containing gas supply pipe system 118 may be configured to supply an Ar gas or the like as a purge gas.

Further, in this embodiment, the manganese compound gas and the oxygen-containing gas has been configured to share the gas chamber 115a of the gas shower head 115 and to be alternately supplied into the processing container 110 through the gas discharge holes 115b. However, the present disclosure is not limited thereto. For example, a gas chamber for exclusive use of the manganese compound gas and a gas chamber for exclusive use of the oxygen-containing gas may be separately installed in the gas shower head 115 such that the manganese compound gas and the oxygen-containing gas is separately supplied into the processing container 110.

In the film forming apparatus configured as above, the wafer W is transferred into the processing container 110 through the transfer port 114 and is mounted on the mounting table 111 adjusted to have a predetermined temperature. Thereafter, in a state where the interior of the processing chamber 110 is adjusted to have a predetermined pressure, a manganese-oxide-containing film having a predetermined film thickness is formed by an ALD method in which the supply of the manganese compound gas from the manganese compound gas supply pipe system 116 and the supply of the oxygen-containing gas from the oxygen-containing gas supply pipe system 118 are repeated plural times while purging the interior of the processing container 110 between the supply of the manganese compound gas and the supply of the oxygen-containing gas. Upon completion of the film formation, the processed wafer W is unloaded through the transfer port 114.

[Hydrogen Radical Treating Apparatus]

Next, one example of the hydrogen radical treating apparatus used for the processing system 20 will be described.

Figure 8:
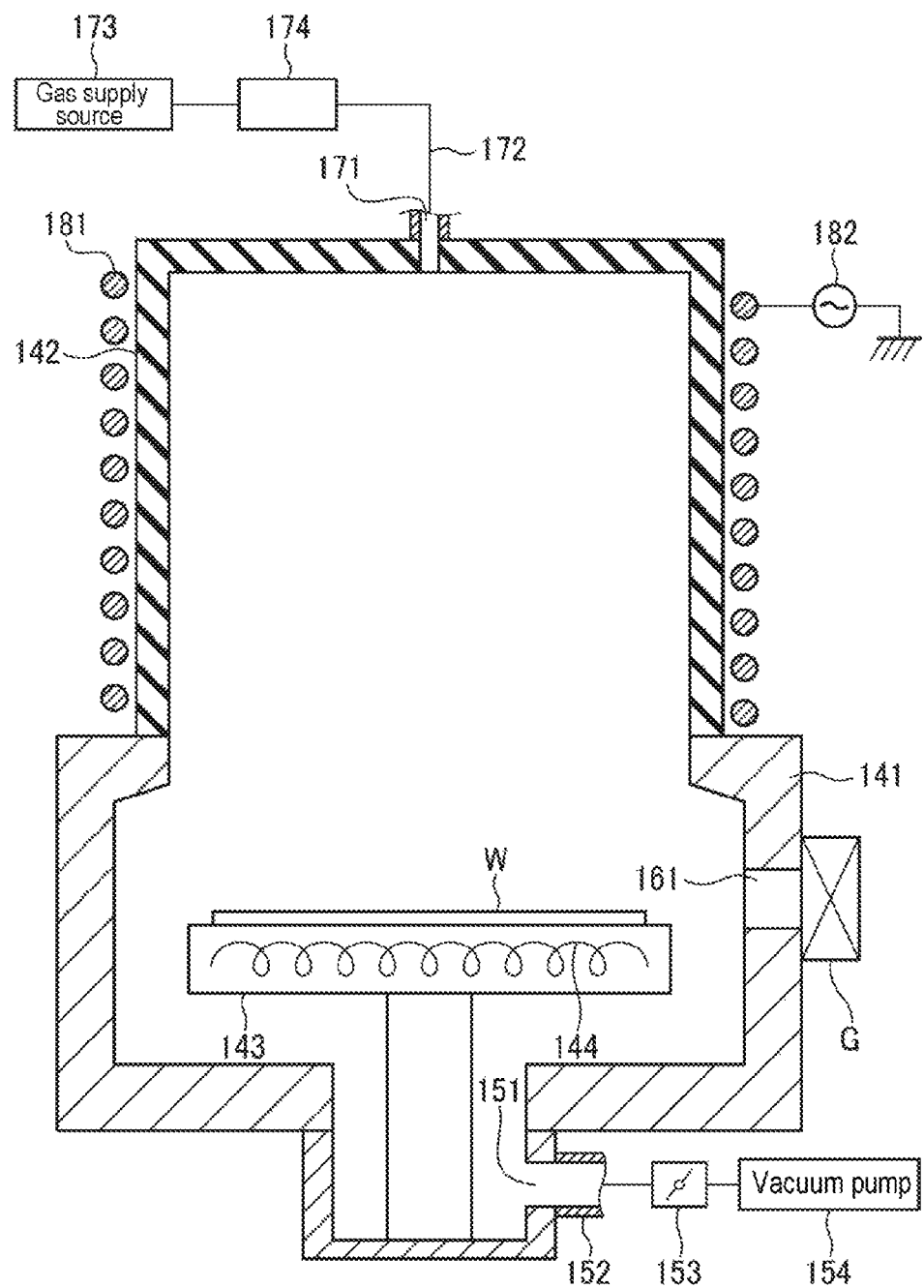
FIG. 8 is a sectional view illustrating one example of a hydrogen radical treating apparatus.

FIG. 8 is a sectional view illustrating one example of the hydrogen radical treating apparatus. An example in which hydrogen radicals are generated inside the processing container by a remote plasma treatment, will be described.

As shown in FIG. 8, the hydrogen radical treating apparatus includes a cylindrical processing container 141 made of, e.g., aluminum or the like and configured to perform the hydrogen radical treatment, and a cylindrical bell jar 142 made of dielectric and disposed above the processing container 141. The bell jar 142 is smaller in diameter than the processing container 141. A wall portion of the processing container 141 and a wall portion of the bell jar 142 are air-tightly connected to each other and are in communication with each other.

A mounting table 143 made of ceramics such as MN or the like and configured to mount the wafer W thereon, is disposed inside the processing container 141. A heater 144 is installed within the mounting table 143. The heater 144 generates heat based on power fed from a heater power supply (not shown). Three support pins (not shown) for transferring the wafer are installed in the mounting table 143 such that they can be protruded from and retracted into the surface of the mounting table 143.

An exhaust port 151 is formed in the bottom portion of the processing container 141. The exhaust port 151 is connected to an exhaust pipe 152. A throttle valve 153 configured to adjust a pressure and a vacuum pump 154 are connected to the exhaust pipe 152 so that the interiors of the processing container 141 and the bell jar 142 are evacuated. In the meantime, a wafer loading/unloading port 161 is formed in the side wall of the processing container 141. The wafer loading/unloading port 161 can be opened and closed by a gate valve G. The wafer W is loaded or unloaded with the gate valve G opened.

A gas introduction port 171 is formed in the center of the ceiling wall of the bell jar 142. A gas supply pipe 172 is connected to the gas introduction port 171. The gas supply pipe 172 is connected to a gas supply source 173 configured to supply a hydrogen gas, an inert gas or the like used for the hydrogen radical treatment. In addition, a gas control part 174 including a mass flow controller, a valve and so on, is installed in the gas supply pipe 172.

A coil 181 acting as an antenna is wound around the bell jar 142. An RF power supply 182 is connected to the coil 181. RF power is supplied to the coil 181 while supplying the hydrogen gas and the inert gas into the bell jar 142. Then, inductively-coupled plasma is generated inside the bell jar 142 so that a manganese-oxide-containing film of the wafer W is subjected to the hydrogen plasma treatment inside the processing container 141.

In the hydrogen radical treating apparatus configured as above, the gate valve G is opened and the wafer W is mounted on the mounting table 143. The gate valve G is closed and the interiors of the processing container 141 and the bell jar 142 are exhausted by the vacuum pump 154. The interiors of the processing container 141 and the bell jar 142 are adjusted to have a predetermined pressure by the throttle valve 153. The wafer W mounted on the mounting table 143 is heated to a predetermined temperature by the heater 144. In addition, the hydrogen gas, the inert gas or the like used for the hydrogen radical treatment is supplied from the gas supply source 173 into the processing container 141 through the gas supply pipe 172 and the gas supply port 171. The RF power is applied from the RF power supply 182 to the coil 181 so that the hydrogen gas, the inert gas or the like is excited inside the bell jar 142, thus generating inductively-coupled plasma. The inductively-coupled plasma is introduced into the processing container 141. Subsequently, the manganese-oxide-containing film of the wafer W is subjected to the hydrogen plasma treatment by hydrogen radicals in the generated plasma.

Other Applications

Although the embodiments of the present disclosure have been described above, the present disclosure is not limited to the above embodiments but may be modified in different ways. For example, although the TiN pattern is used as a metal pattern in the above embodiments, other Ti-containing films may be appropriately used. In addition, the metal pattern is not limited to the Ti-containing film but may be any metal film as long as an oxide having a robust bond and being not substantially reduced by a reduction treatment in the formation of a metal oxide film, is formed.

In addition, although in the above embodiments, there has been illustrated an example in which the manganese-oxide-containing film is used as the metal oxide film which is a portion of the inversion material, the present disclosure is not limited thereto. For example, the present disclosure may be applied to any metal oxide film as long as an oxide film having a relatively strong oxygen bond with respect to a metal pattern rather than the etching target film can be formed on the metal pattern.

Furthermore, although in the above embodiments, there has been illustrated an example in which the hydrogen radical treatment is used as the reduction treatment, the present disclosure is not limited thereto. For example, the present disclosure may employ any reduction treatment as long as a metal oxide film formed on a metal pattern can be defined as a first metal-containing film as an oxide and a metal oxide film formed on an etching target film can be defined as a second metal-containing film whose surface is reduced into metal.

Furthermore, although in the above embodiments, there has been illustrated an example in which the Ru film is used as a metal film constituting a portion of the inversion material, the present disclosure is not limited thereto. For example, the present disclosure may be applied to any metal film as long as it is easily formed on metal and is hard to form on an oxide.

In addition, although in the above embodiments, there has been illustrated an example in which the semiconductor wafer is used as a target substrate, the present disclosure is not limited thereto. For example, the semiconductor wafer may include compound semiconductors such as GaAs, SiC, GaN and the like, in addition to silicon. Furthermore, in addition the semiconductor wafer, the present disclosure may be applied to a glass substrate used for a flat panel display (FPD) such as a liquid crystal display or the like, a ceramics substrate, or the like.

According to the present disclosure in some embodiments, since a metal film can be selectively formed in a portion corresponding to an etching target film, it is possible to eliminate a need to etch back an inversion material and provide little deviation when a pattern is inverted.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pattern forming method, comprising:
   forming a metal oxide film as a portion of an inversion material on a substrate including an etching target film and a metal pattern formed on the etching target film, and forming an oxide film on the metal pattern, the oxide film having a relatively strong oxygen bond with respect to the metal pattern rather than the etching target film;
   subsequently, performing a reduction treatment such that the metal oxide film formed on the metal pattern is defined as a first metal-containing film which remains as an oxide and the metal oxide film formed on the etching target film is defined as a second metal-containing film whose surface is reduced into metal;
   subsequently, selectively forming a metal film, as a portion of the inversion material, on only the second metal-containing film formed on the etching target film, the metal film having such a property that it is easy to be formed on metal and is hard to be formed on an oxide; and
   subsequently, obtaining an inversion pattern composed of the inversion material by etching away the metal pattern and leaving the inversion material composed of the first metal-containing film and the second metal-containing film, which are obtained from the metal oxide film, and the metal film.

2. The method of claim 1, wherein the forming a metal oxide film includes forming a manganese-oxide-containing film by ALD.

3. The method of claim 2, wherein the metal pattern includes a Ti-containing film and the manganese-oxide-containing film formed on the metal pattern includes $MnTiO_3$ or $Mn_2TiO_4$.

4. The method of claim 3, wherein the metal pattern includes a TiN film.

5. The method of claim 2, wherein the reduction treatment is a hydrogen radical treatment;
   the manganese-oxide-containing film formed on the metal pattern is defined as a first Mn-containing film which remains as an oxide by the reduction treatment; and
   the manganese-oxide-containing film formed on the etching target film is defined as a second Mn-containing film whose surface is reduced into a metal by the reduction treatment.

6. The method of claim 1, wherein the metal film is a Ru film.

7. The method of claim 1, wherein the metal pattern is formed by patterning using a SADP, SAQP or LEx method.

8. The method of claim 1, wherein the etching target film includes a Si-containing film.

9. A pattern forming method, comprising:
   forming a manganese-oxide-containing film as a portion of an inversion material on a substrate including an etching target film and a metal pattern formed on the etching target film, by ALD;
   subsequently, performing a hydrogen radical treatment on a surface of the manganese-oxide-containing film;
   subsequently, forming a Ru film as a portion of the inversion material by CVD; and
   subsequently, obtaining an inversion pattern composed of the inversion material for etching the etching target film, by etching away the metal pattern and leaving the inversion material composed of a material obtained by performing the hydrogen radical treatment on the surface of the manganese-oxide-containing film and the Ru film,
   wherein the metal pattern is made of a material such that the manganese-oxide-containing film formed on the metal pattern is not substantially reduced into a metal Mn with the hydrogen radical treatment,
   wherein the manganese-oxide-containing film formed on the metal pattern is defined as a first Mn-containing film which remains as an oxide when subjecting to the hydrogen radical treatment,
   wherein the manganese-oxide-containing film formed on the etching target film is defined as a second Mn-containing film whose surface is reduced into a metal Mn when subjecting to the hydrogen radical treatment, and wherein the Ru film is not substantially formed on the first Mn-containing film and is selectively formed on the second Mn-containing film.

10. The method of claim 9, wherein the metal pattern includes a Ti-containing film and the manganese-oxide-containing film formed on the metal pattern includes $MnTiO_3$ or $Mn_2TiO_4$.

11. The method of claim 10, wherein the metal pattern includes a TiN film.

12. The method of claim 9, wherein the manganese-oxide-containing film is formed by alternately supplying a manganese compound gas and an oxygen-containing gas into a processing container in which a substrate is disposed, while purging the inside of the processing container between the supply of the manganese compound gas and the supply of the oxygen-containing gas, wherein a temperature of the substrate is set to be lower than a thermal decomposition temperature of the manganese compound gas.

13. The method of claim 9, wherein the hydrogen radical treatment is performed at a temperature of the substrate which falls within a range of 200 to 400 degrees C., for a period of time of 100 sec or longer.

14. The method of claim 13, wherein the hydrogen radical treatment is performed by supplying hydrogen radicals onto the substrate, the hydrogen radicals being generated by plasma of a hydrogen-containing gas.

15. The method of claim 9, wherein a ruthenium carbonyl is used as a film forming raw material in forming the Ru film.

16. The method of claim 9, wherein the forming a manganese-oxide-containing film, the performing a hydrogen radical treatment and the forming a Ru film are continuously performed while maintaining a vacuum state.

17. The method of claim 9, wherein the metal pattern is formed by patterning using a SADP, SAQP or LEx method.

18. The method of claim 9, wherein the etching target film includes a Si-containing film.

* * * * *